US009581647B2

(12) United States Patent
Kuroki (10) Patent No.: US 9,581,647 B2
(45) Date of Patent: Feb. 28, 2017

(54) MOTOR DRIVE HAVING FUNCTION OF DETECTING WELDING OF ELECTROMAGNETIC CONNECTOR

(71) Applicant: FANUC CORPORATION, Yamanashi (JP)

(72) Inventor: Wataru Kuroki, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 14/707,184

(22) Filed: May 8, 2015

(65) Prior Publication Data

US 2015/0323584 A1 Nov. 12, 2015

(30) Foreign Application Priority Data

May 9, 2014 (JP) .................................. 2014-098082

(51) Int. Cl.
*H02H 7/08* (2006.01)
*H02H 7/09* (2006.01)
(Continued)

(52) U.S. Cl.
CPC ....... *G01R 31/3277* (2013.01); *G01R 31/043* (2013.01); *H02H 9/001* (2013.01); *H02P 27/06* (2013.01); *G01R 31/40* (2013.01)

(58) Field of Classification Search
CPC .... B23K 11/257; B23K 11/24; B23K 9/0953; B60L 11/1824; B60L 3/0069; B60L 11/14;
(Continued)

(56) References Cited

U.S. PATENT DOCUMENTS 5,844,193 A * 12/1998 Nomura .................. B23K 11/24
 219/110
6,137,077 A * 10/2000 Moro ................... B23K 11/257
 219/108

(Continued)

FOREIGN PATENT DOCUMENTS

CN 1994692 A 7/2007
JP 2000134707 A 5/2000
(Continued)

OTHER PUBLICATIONS

English Translation of Japanese Publication No. 2011142282, published Jul. 21, 2011, 14 pages.

(Continued)

*Primary Examiner* — Paul Ip
(74) *Attorney, Agent, or Firm* — Fredrikson & Byron, P.A.

(57) ABSTRACT

A motor drive includes an electromagnetic connector for connecting an alternating current (AC) power source to an AC/DC conversion unit or disconnecting therefrom, a DC link unit, a DC/AC conversion unit for converting smoothed direct current voltage to AC voltage, a DC link voltage detection unit for measuring voltage of the DC link unit, and a control unit. The control unit includes a time measurement unit for measuring elapsed time since switching by the electromagnetic connector, and a welding judgment unit for judging that the electromagnetic connector is welded, provided that the difference between voltage between terminals of the DC link unit after charging the DC link unit and voltage between the terminals of the DC link unit after predetermined time has elapsed since disconnecting the AC power source from the AC/DC conversion unit, after the charge of the DC link unit, is less than a predetermined voltage level.

3 Claims, 8 Drawing Sheets (51) Int. Cl.
*G01R 31/327* (2006.01)
*G01R 31/04* (2006.01)
*H02P 27/06* (2006.01)
*H02H 9/00* (2006.01)
*G01R 31/40* (2014.01)

(58) Field of Classification Search
CPC .............. B60L 11/1814; B60L 11/1816; B60L 2210/30; B60L 2240/527; B60L 2240/529; B60L 3/003; B60L 3/04; B60L 8/003
USPC ............... 318/490, 400.21, 400.22; 307/125; 361/46
See application file for complete search history.

(56) References Cited

U.S. PATENT DOCUMENTS

| | | | | |
|---|---|---|---|---|
| 6,157,097 | A * | 12/2000 | Hirose | H02M 7/062 307/125 |
| 7,319,206 | B2 * | 1/2008 | Thommes | B23H 7/08 219/130.1 |
| 2010/0194354 | A1 * | 8/2010 | Gotou | B60L 3/003 320/163 |
| 2011/0122536 | A1 * | 5/2011 | Watanabe | B60L 3/0069 361/46 |
| 2011/0163759 | A1 * | 7/2011 | Ishii | H02H 3/162 324/551 |

FOREIGN PATENT DOCUMENTS

| | | |
|---|---|---|
| JP | 3506590 B2 | 3/2004 |
| JP | 2005056728 A | 3/2005 |
| JP | 2005261040 A | 9/2005 |
| JP | 2007181885 A | 7/2007 |
| JP | 2009153274 A | 7/2009 |
| JP | 2011142282 A | 7/2011 |
| WO | 2013160067 A2 | 10/2013 |

OTHER PUBLICATIONS

English Translation of Japanese Publication No. 2005261040, published Sep. 22, 2005, 13 pages.
English Translation of Japanese Publication No. 2005056728, published Mar. 3, 2005, 14 pages.
English Translation of Japanese Publication No. 2000134707, published May 12, 2000, 10 pages.
English Abstract for Japanese Publication No. 2007-181885 A, published Jul. 19, 2007, 16 pages.
English Abstract for Japanese Publication No. 3506590 B2, published Mar. 15, 2004, 30 pages.
Translated Decision to Grant for Japanese Application No. 2014-098082, Date of Mailing: Nov. 17, 2015, 3 pages.
Untranslated Decision to Grant for Japanese Application No. 2014-098082, Date of Mailing: Nov. 17, 2015, 3 pages.
Translated Notification of Reasons for Refusal for Japanese Application No. 2014-098082, Date of Mailing: Jun. 30, 2015, 2 pages.
Untranslated Notification of Reasons for Refusal for Japanese Application No. 2014-098082, Date of Mailing: Jun. 30, 2015, 2 pages.
English Abstract for Japanese Publication No. 2009-153274 A, published Jul. 9, 2009, 1 pg.
English Abstract for Chinese Publication No. 1994692 A, Jul. 11, 2007, 2 pgs.

* cited by examiner

MOTOR DRIVE HAVING FUNCTION OF DETECTING WELDING OF ELECTROMAGNETIC CONNECTOR

CROSS-REFERENCE TO RELATED APPLICATIONS

This application is a new U.S. patent application that claims benefit of JP 2014-098082, filed on May 9, 2014, the entire content of JP 2014-098082 is hereby incorporated by reference.

FIELD OF THE INVENTION

The present invention relates to a motor drive and, more specifically, a motor drive having the function of detecting whether or not an electromagnetic connector, which makes connection to or disconnection from a power source, has been welded.

BACKGROUND OF THE INVENTION

In motor control devices for driving machine tools, industrial machines, robots and the like, there is a known method for preventing a motor from operating in case of emergency shut-down or raising an alarm, by which an electromagnetic connector provided in an input power line is turned off to disconnect the motor control device from a power source so that power supply from the power source is stopped (for example, Japanese Patent No. 3506590 (JP 3506590 B)).

According to this conventional method, excessive current passing through the electromagnetic connector can possibly weld a contact and disable the electromagnetic connector from disconnecting. Therefore, generally a method in which the electromagnetic connector is turned on and off in a state of stopping a machine and consuming no energy, and an auxiliary contact of the electromagnetic connector is monitored at this time in order to check the presence or absence of welding of the electromagnetic connector is used (for example, Japanese Patent Laid-Open Publication No. 2007-181885 (JP 2007-181885 A)).

However, this conventional art requires providing the electromagnetic connector having the auxiliary contact, and also an additional circuit for monitoring the auxiliary contact in a motor drive or the outside thereof, resulting in an increase in costs.

An object of the present invention is to provide a motor drive that can detect the presence or absence of welding of an electromagnetic connector without an increase in costs, by utilizing a DC link voltage detection unit or a current detection unit, without requiring the provision of the auxiliary contact of the electromagnetic connector and the additional circuit.

SUMMARY OF THE INVENTION

A motor drive according to one embodiment of the present invention includes an AC/DC conversion unit for converting alternating current (AC) voltage supplied from an AC power source to direct current (DC) voltage, an electromagnetic connector for performing switching to connect or disconnect the AC power source to or from the AC/DC conversion unit, a DC link unit for smoothing the DC voltage outputted from the AC/DC conversion unit, a DC/AC conversion unit for converting the DC voltage smoothed by the DC link unit to AC voltage for motor driving, a DC link voltage detection unit for measuring voltage between terminals of the DC link unit, and a control unit for outputting a command to connect or disconnect the electromagnetic connector and controlling the AC/DC conversion unit. The control unit is characterized by including a time measurement unit for measuring elapsed time since the switching to disconnect the electromagnetic connector is performed, and a welding judgment unit for judging that the electromagnetic connector is welded, in a case where the difference between the voltage between the terminals of the DC link unit after charging the DC link unit by connecting the AC power source to the AC/DC conversion unit and the voltage between the terminals of the DC link unit after a lapse of predetermined time since the control unit outputs the command to disconnect the AC power source from the AC/DC conversion unit, after the charge of the DC link unit is performed, is less than a predetermined voltage level.

DESCRIPTION OF THE DRAWINGS

The objects, features, and advantages of the present invention will become more apparent from the following description of embodiments taken in conjunction with accompanying drawings, in which.

DETAILED DESCRIPTION OF THE PREFERRED EMBODIMENT

Referring to the drawings, motor drives according to the present invention will be hereinafter described. Note that, the technical scope of the invention is not limited to embodiments thereof, and extends to the invention defined in claims and equivalents thereof.

First Embodiment

Figure 1:
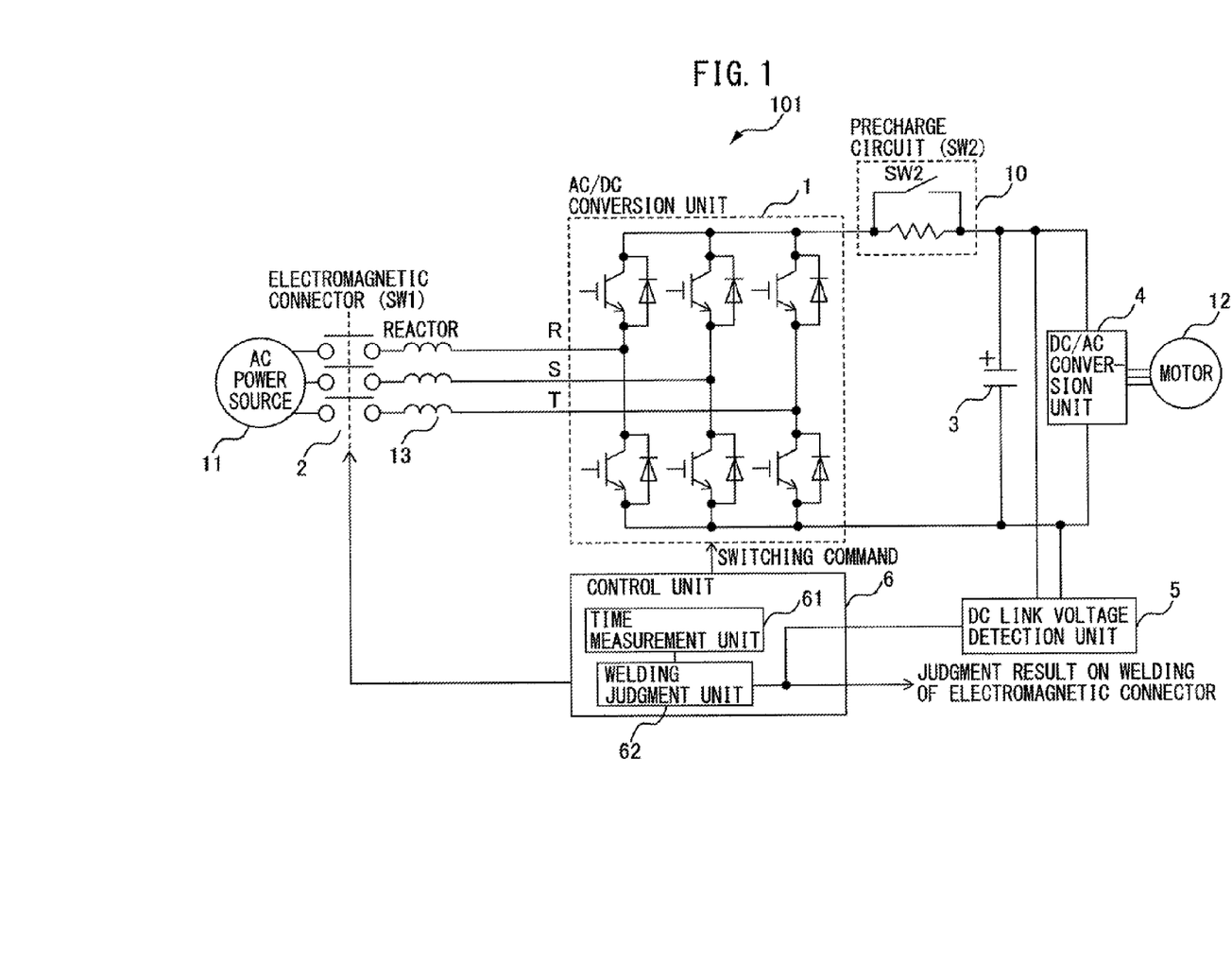
FIG. 1 is a block diagram of a motor drive according to a first embodiment of the present invention.

First, a motor drive according to a first embodiment of the present invention will be described with reference to the drawings. FIG. 1 shows a block diagram of the motor drive according to the first embodiment of the invention. A motor drive 101 according to the first embodiment of the invention includes an AC/DC conversion unit 1 configured to convert alternating current (AC) voltage supplied from an AC power source 11 to direct current (DC) voltage, an electromagnetic connector 2 configured to switch between connection and disconnection of the AC power source 11 to and from the AC/DC conversion unit 1, a DC link unit 3 configured to smooth the DC voltage outputted from the AC/DC conversion unit 1, a DC/AC conversion unit 4 configured to convert the DC voltage smoothed by the DC link unit 3 to AC voltage for motor driving, a DC link voltage detection unit 5 configured to measure voltage between terminals of the DC link unit 3, and a control unit 6 configured to output a command to connect or disconnect the electromagnetic connector 2 and control the AC/DC conversion unit 1. The control unit 6 includes a time measurement unit 61 and a welding judgment unit 62. The time measurement unit 61 measures elapsed time from the switching of the electromagnetic connector 2. The welding judgment unit 62 judges that the electromagnetic connector 2 is welded, in a case where the difference between the voltage between the terminals of the DC link unit 3 after charging the DC link unit 3 by connecting the AC power source 11 to the AC/DC conversion unit 1 and the voltage between the terminals of the DC link unit 3 after a lapse of predetermined time since the control unit 6 outputs the command to disconnect the AC power source 11 from the AC/DC conversion unit 1 after the charge of the DC link unit 3 is less than a predetermined voltage level.

The electromagnetic connector 2 is provided between the AC power source 11 and the AC/DC conversion unit 1, and switches between connection and disconnection of the AC power source 11 to and from the AC/DC conversion unit 1. A switch provided in the electromagnetic connector 2 performs a switching operation of the electromagnetic connector 2 between connection and disconnection based on a command (control signal) from the control unit 6. Note that, a reactor 13 may be provided between the electromagnetic connector 2 and the AC/DC conversion unit 1.

The AC/DC conversion unit 1, being a converter for converting the AC voltage to the DC voltage, includes six semiconductor switching elements and six diodes. The switching of the semiconductor switching elements is performed based on a switching command from the control unit 6.

The DC link unit 3 smooths the DC voltage outputted from the AC/DC conversion unit 1. The DC link unit 3 is provided with a smoothing capacitor. A precharge circuit 10 may be provided to protect the smoothing capacitor in a charge after fully discharging the smoothing capacitor.

The DC/AC conversion unit 4 converts the DC voltage smoothed by the DC link unit 3 to the AC voltage to drive a motor 12. As the DC/AC conversion unit 4, an inverter is usable.

The DC link voltage detection unit 5 measures the voltage between both the terminals of the DC link unit 3, and sends a measurement result to the welding judgment unit 62 of the control unit 6.

The control unit 6 is provided with the time measurement unit 61 and the welding judgment unit 62. The time measurement unit 61 measures the elapsed time since the switching of the electromagnetic connector 2. More specifically, the time is measured based on the signal that the control unit 6 outputs to make the electromagnetic connector 2 perform the switching operation.

In the motor drive according to the present embodiment, the voltage of the DC link unit 3 that is in a charged state is compared with the voltage of the DC link unit 3 that is in a discharged state. Provided that a decrease in the voltage of the DC link unit 3 is small, in other words, the decrease in the DC link voltage is less than the predetermined voltage level, it is judged that welding occurs in the electromagnetic connector 2. This is because if welding occurs in the electromagnetic connector 2, electric power is constantly fed from the AC power source 11, and the DC link unit 3 is continuously charged. On the other hand, in a case where no welding occurs in the electromagnetic connector 2, the voltage between both the terminals of the DC link unit 3 decreases due to spontaneous discharge of the DC link unit 3. Here, the predetermined voltage level of the DC link unit 3, which is used for judging whether welding of the electromagnetic connector 2 occurs, corresponds with a decrease in the voltage of the DC link unit 3 after a lapse of predetermined time since the DC link unit 3 is discharged in the absence of welding in the electromagnetic connector 2.

Next, a method for judging the presence or absence of welding in the electromagnetic connector 2 according to the present embodiment will be described. As described above, the DC link voltage detection unit 5 measures the voltage between the terminals of the DC link unit 3 at least two times. To be more specific, in the first measurement, the voltage between the terminals of the DC link unit 3 is measured after charging the DC link unit 3 by connecting the AC power source 11 to the AC/DC conversion unit 1 by the switching operation for conduction of the electromagnetic connector 2. The voltage between the terminals of the DC link unit 3 at this time is referred to as $V_0$.

In the second measurement, the voltage between the terminals of the DC link unit 3 is measured at time $t_1$ after a lapse of predetermined time since the command to disconnect the AC power source 11 from the AC/DC conversion unit 1 is outputted at time $t_0$ by the switching operation for disconnecting the electromagnetic connector 2, after the charge of the DC link unit 3. The voltage between the terminals of the DC link unit 3 at this time is referred to as $V_1$. Here, the predetermined time refers to time from the time $t_0$ to the time $t_1$, and is enough time (approximately ten seconds) to discharge the voltage with which the DC link unit 3 is charged. The time measurement unit 61 measures elapsed time from the time $t_0$ to the time $t_1$.

Figure 2A:
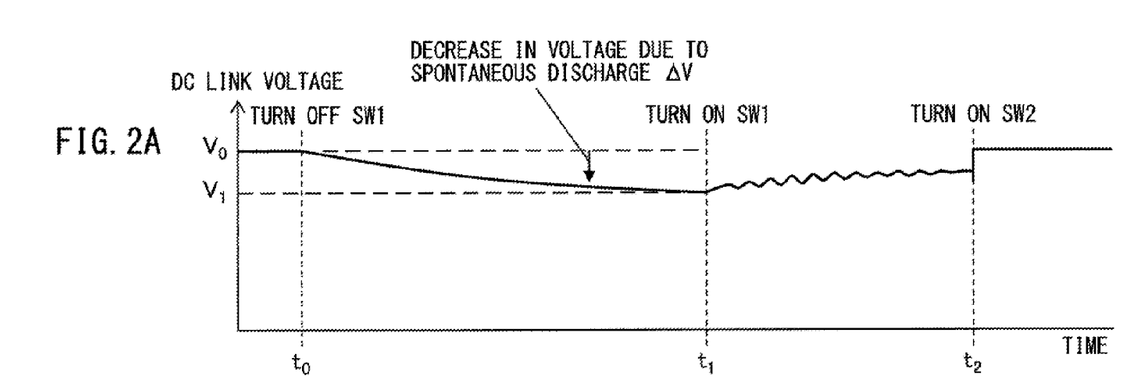
FIG. 2A is a graph showing temporal variation in voltage of a DC link unit in the absence of welding of an electromagnetic connector, in the motor drive according to the first embodiment of the present invention.
Figure 2B:
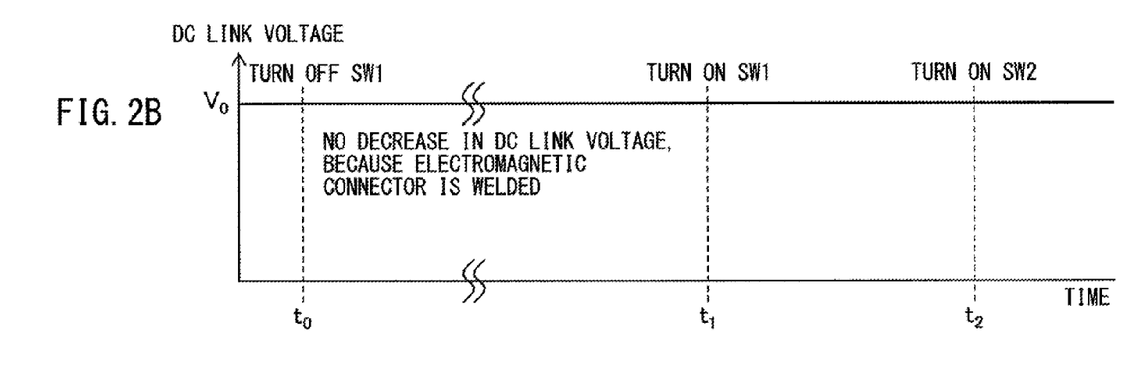
FIG. 2B is a graph showing temporal variation in voltage of the DC link unit in the presence of welding of the electromagnetic connector, in the motor drive according to the first embodiment of the present invention.

FIGS. 2A and 2B are graphs showing temporal variation in the voltage of the DC link unit in the absence of welding of the electromagnetic connector 2 and in the presence thereof, respectively, in the motor drive 101 according to the first embodiment of the present invention. FIG. 2A shows the temporal variation in the DC link voltage in the absence of welding in the electromagnetic connector 2. FIG. 2B shows the temporal variation in the DC link voltage in the presence of welding of the electromagnetic connector 2.

As shown in FIG. 2A, in the absence of welding in the electromagnetic connector 2, the voltage of the DC link unit 3 decreases from $V_0$ at the time $t_0$ to $V_1$ at the time $t_1$, due to the spontaneous discharge of the DC link unit 3. Accordingly, the voltage of the DC link unit 3 decreases during a lapse of the predetermined time from the time $t_0$ to the time $t_1$. In a case where the difference $\Delta V = V_0 - V_1$ is the predetermined voltage level or more, it is judged that the electromagnetic connector 2 is not welded.

On the other hand, as shown in FIG. 2B, in the presence of welding of the electromagnetic connector 2, since the DC link unit 3 is continuously charged by the AC power source 11, the voltage $V_1$ of the DC link unit 3 at the time $t_1$ is approximately equal to the voltage $V_0$ at the time $t_0$. Therefore, the difference $\Delta V=V_0-V_1$ in the voltage of the DC link unit 3 during a lapse of the predetermined time from the time $t_0$ to the time $t_1$ is less than the predetermined voltage level. In this case, the electromagnetic connector 2 is judged to be welded.

Note that, in the above description, the voltage between the terminals of the DC link unit 3 is measured at the time $t_0$ when the DC link unit 3 is completely charged, but the measurement of the voltage may be omitted, provided that the voltage between the terminals of the DC link unit 3 is already known or can be estimated. In this case, an already known voltage value between the terminals of the DC link unit 3 in a fully charged state is stored in a memory (not shown). In calculating the difference with the voltage $V_1$ between the terminals of the DC link unit 3, which is measured at the time $t_1$ when the spontaneous discharge is supposed to complete, the already known voltage level is read out of the memory. This eliminates the step of calculating the voltage between the terminals of the DC link unit 3 at the time $t_0$, and hence facilitates quickly judging the presence or absence of welding of the electromagnetic connector 2.

Figure 3:
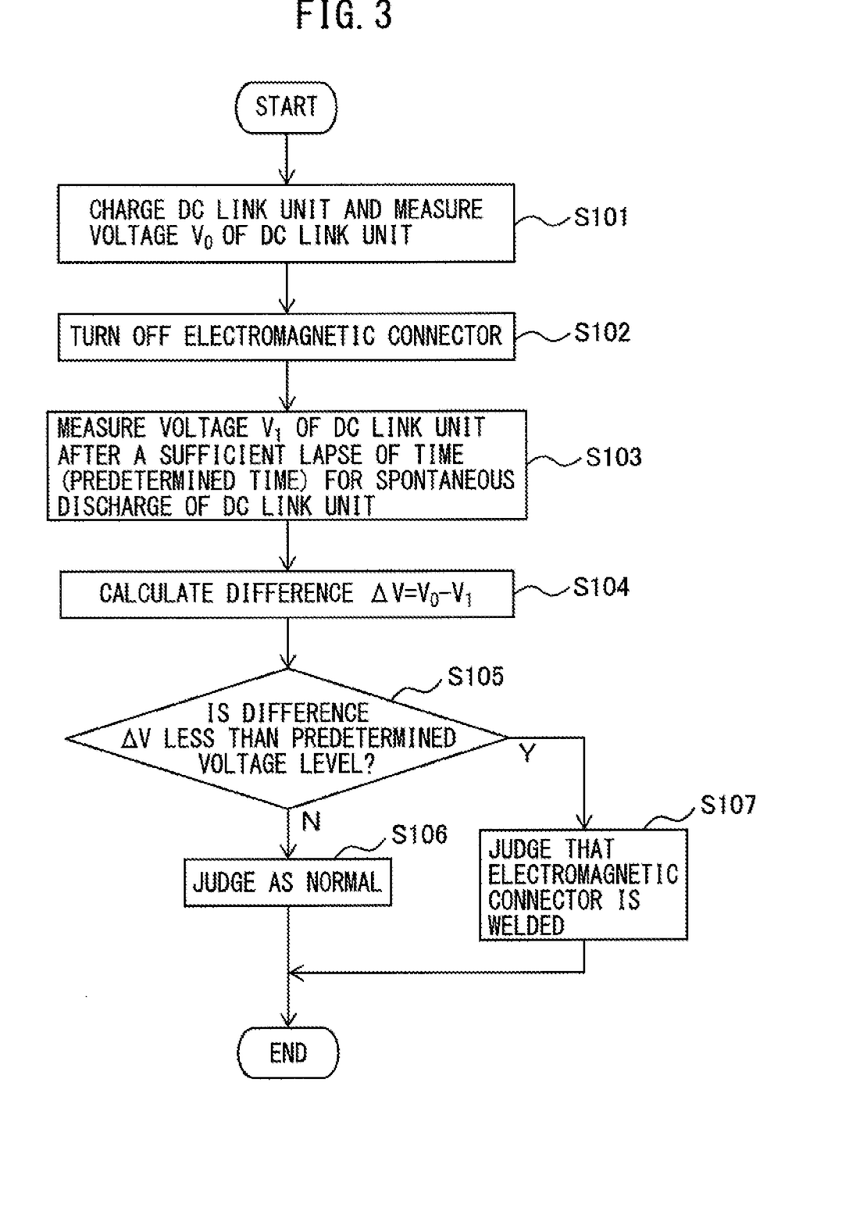
FIG. 3 is a flowchart that explains a procedure to detect the presence or absence of welding of the electromagnetic connector by the motor drive according to the first embodiment of the present invention.

Next, the operation procedure of the motor drive 101 according to the first embodiment of the present invention will be described with the use of the flowchart of FIG. 3. First, at step S101, the DC link unit 3 is charged by turning on the switch of the electromagnetic connector 2, and the DC link voltage detection unit 5 measures the voltage $V_0$ between the terminals of the DC link unit 3 at this time. A measurement result is sent to the welding judgment unit 62. The measurement result may be stored in the memory (not shown).

Next, at step S102, the control unit 6 outputs the command to turn off the switch of the electromagnetic connector 2 to disconnect the AC power source 11 from the AC/DC conversion unit 1. At this time, if the electromagnetic connector 2 is working normally, the switch of the electromagnetic connector 2 is disconnected. However, if the switch of the electromagnetic connector 2 is welded, the switch is not disconnected because of having a contact.

Then, at step S103, the DC link voltage detection unit 5 measures the voltage $V_1$ of the DC link unit 3 after a lapse of time (predetermined time, for example, of the order of ten seconds) enough for the spontaneous discharge of the DC link unit 3. A measurement result is sent to the welding judgment unit 62. The measurement result may be stored in the memory (not shown).

Then, at step S104, the welding judgment unit 62 calculates the difference $\Delta V=V_0-V_1$ between the voltage $V_0$ between the terminals of the DC link unit 3 after the charge of the DC link unit 3 and the voltage $V_1$ between the terminals of the DC link unit 3 after the predetermined time has elapsed since the output of the command to turn off the electromagnetic connector 2.

Then, at step S105, the welding judgment unit 62 judges whether or not the difference $\Delta V$ is less than the predetermined voltage level. In a case where the difference $\Delta V$ is the predetermined voltage level or more and the DC link unit 3 is judged to be discharged, it is judged at step S106 that the electromagnetic connector 2 has no welding, in other words, is in a normal state.

On the other hand, in a case where the difference $\Delta V$ is less than the predetermined voltage level and the DC link unit 3 is judged not to be discharged, it is judged at step S107 that welding occurs in the electromagnetic connector 2.

A judgment result as for whether or not the electromagnetic connector 2 is welded, obtained as described above, is outputted from the welding judgment unit 62 to the outside.

As described above, according to the motor drive 101 of the first embodiment of the present invention, after the DC link unit 3 is charged by turning on the electromagnetic connector 2, the command to turn off the electromagnetic connector 2 is outputted, and whether or not the DC link unit 3 is discharged is checked. Thereby it is possible to judge the presence or absence of welding of the electromagnetic connector 2.

Second Embodiment

Figure 4:
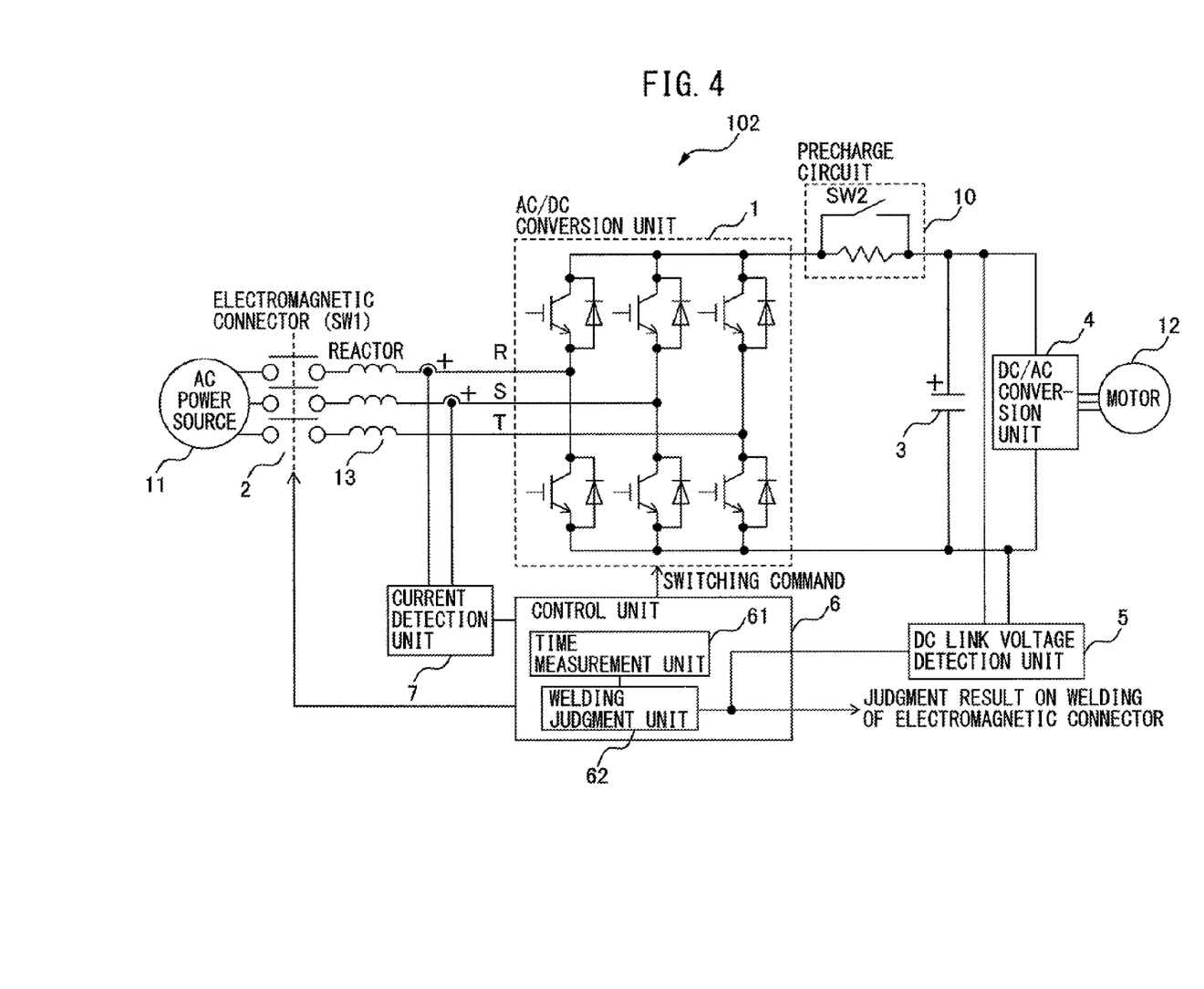
FIG. 4 is a block diagram of a motor drive according to a second embodiment of the present invention.

Next, a motor drive according to a second embodiment of the present invention will be described with the use of the drawings. FIG. 4 shows a block diagram of the motor drive according to the second embodiment of the invention. A motor drive 102 according to the second embodiment of the invention further includes a current detection unit 7 for detecting current inputted from the AC power source 11 to the AC/DC conversion unit 1, in addition to the motor drive 101 of the first embodiment. The motor drive 102 is characterized in that the welding judgment unit 62 judges that the electromagnetic connector 2 is welded, in a case where current measured by the current detection unit 7 upon outputting a command by the control unit 6 to connect the AC power source 11 to the AC/DC conversion unit 1, after a lapse of predetermined time since the control unit 6 outputs a command to disconnect the AC power source 11 from the AC/DC conversion unit 1, is less than a predetermined current level. Since the other structures of the motor drive 102 according to the second embodiment is the same as those of the motor drive 101 of the first embodiment, the detailed description thereof will be omitted.

The current detection unit 7 detects current inputted from the AC power source 11 to the AC/DC conversion unit 1. FIG. 4 shows an example of detecting current of two phases, i.e. an R phase and an S phase. However, the present invention is not limited to this, but current of only one phase or all three phases may be detected instead. Data on the current detected by the current detection unit 7 is sent to the control unit 6, and used for judging whether or not the electromagnetic connector 2 is welded, as described later on.

Next, a method for judging the presence or absence of welding in the electromagnetic connector 2 according to the present embodiment will be described. In the present embodiment, the smoothing capacitor of the DC link unit 3 is spontaneously discharged by outputting a command to turn off the electromagnetic connector 2, that is, a command to disconnect the AC power source 11 from the AC/DC conversion unit 1. Then, at the instant when the AC power source 11 is connected to the AC/DC conversion unit 1 by outputting a command to turn on the electromagnetic connector 2, the current detection unit 7 detects current flowing from the AC power source 11 to the AC/DC conversion unit 1.

A current value detected by the current detection unit 7 differs depending on whether or not the electromagnetic connector 2 is welded. In other words, welding of the electromagnetic connector 2 brings about a state of connecting the AC power source 11 to the AC/DC conversion unit 1, so that the DC link unit 3 is continuously charged irrespective of the output of the command to turn off the electromagnetic connector 2, and therefore the smoothing capacitor of the DC link unit 3 maintains a charged state. As a result, even if the electromagnetic connector 2 is turned on after a sufficient lapse of time for the spontaneous discharge of the DC link unit 3 for the purpose of recharging the DC link unit 3, the DC link unit 3 cannot be charged and no input current flows.

On the other hand, if the electromagnetic connector 2 is not welded, the command to turn off the electromagnetic connector 2 disconnects the AC power source 11 from the AC/DC conversion unit 1 normally, and hence the smoothing capacitor of the DC link unit 3 is spontaneously discharged and has rechargeable space. As a result, input current flows, if the electromagnetic connector 2 is turned on after the sufficient lapse of the time for the spontaneous discharge of the DC link unit 3 for the purpose of recharging the DC link unit 3.

Figures 5A, 5B:
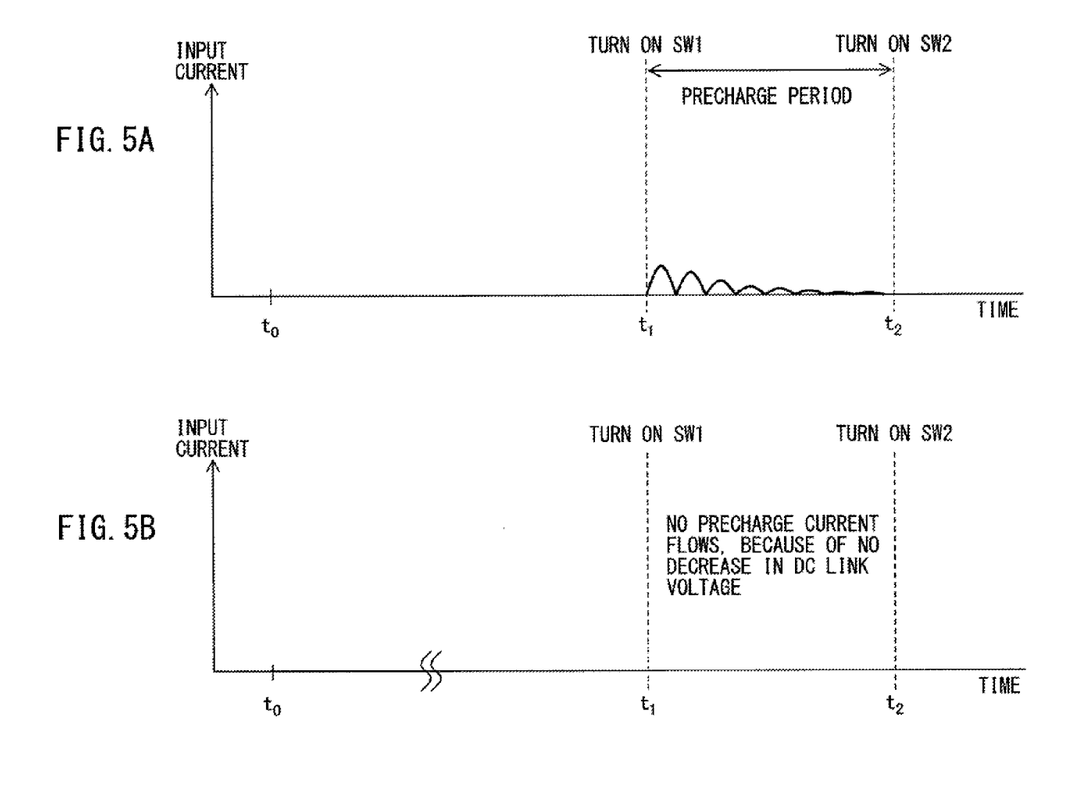
FIG. 5A is a graph showing temporal variation in input current in the absence of welding of an electromagnetic connector, in the motor drive according to the second embodiment of the present invention.
FIG. 5B is a graph showing temporal variation in input current in the presence of welding of the electromagnetic connector, in the motor drive according to the second embodiment of the present invention.

FIGS. 5A and 5B are graphs showing temporal variation in input current in the presence and absence of welding of the electromagnetic connector 2, respectively, in the motor drive 102 according to the second embodiment of the present invention. FIG. 5A shows the temporal variation in the input current in the absence of welding in the electromagnetic connector 2. FIG. 5B shows the temporal variation in the input current in the presence of welding in the electromagnetic connector 2.

As shown in FIG. 5A, in a case where there is no welding in the electromagnetic connector 2, the DC link unit 3 is spontaneously discharged. At time tx after a lapse of time (of the order of ten seconds) enough for discharging the smoothing capacitor of the DC link unit 3, the DC link unit 3 falls in voltage and the smoothing capacitor is formed with space for accumulating a predetermined amount of electric charge. Upon outputting the command to turn on the electromagnetic connector 2 at the time $t_1$, the AC power source 11 is normally connected to the AC/DC conversion unit 1. The smoothing capacitor of the DC link unit 3 is charged, and the current detection unit 7 detects an input current of the predetermined level or more, as shown in FIG. 5A. Based on this input current of the predetermined current level or more, it is judged that no welding occurs in the electromagnetic connector 2. Here, a resistance of the precharge circuit 10 restricts the value of the input current so as to prevent a large current flow.

On the other hand, as shown in FIG. 5B, welding in the electromagnetic connector 2 brings about a state of connecting the AC power source 11 to the AC/DC conversion unit 1 irrespective of the command to turn off the electromagnetic connector 2, so that the DC link unit 3 is continuously charged from the AC power source 11. Thus, the voltage ($V_1$) of the DC link unit 3 at the time $t_1$ is approximately the same as the voltage ($V_0$) thereof at time $t_0$. Accordingly, the voltage of the DC link unit 3 hardly falls during the lapse of the predetermined time from the time $t_0$ to the time $t_1$, so that the smoothing capacitor of the DC link unit 3 is formed with no space for newly accumulating electric charge. Therefore, no input current flows, even if the AC power source 11 is connected to the AC/DC conversion unit 1 by outputting the command to turn on the electromagnetic connector 2 at the time $t_1$. Thereby, the electromagnetic connector 2 is judged to be welded.

Figure 6:
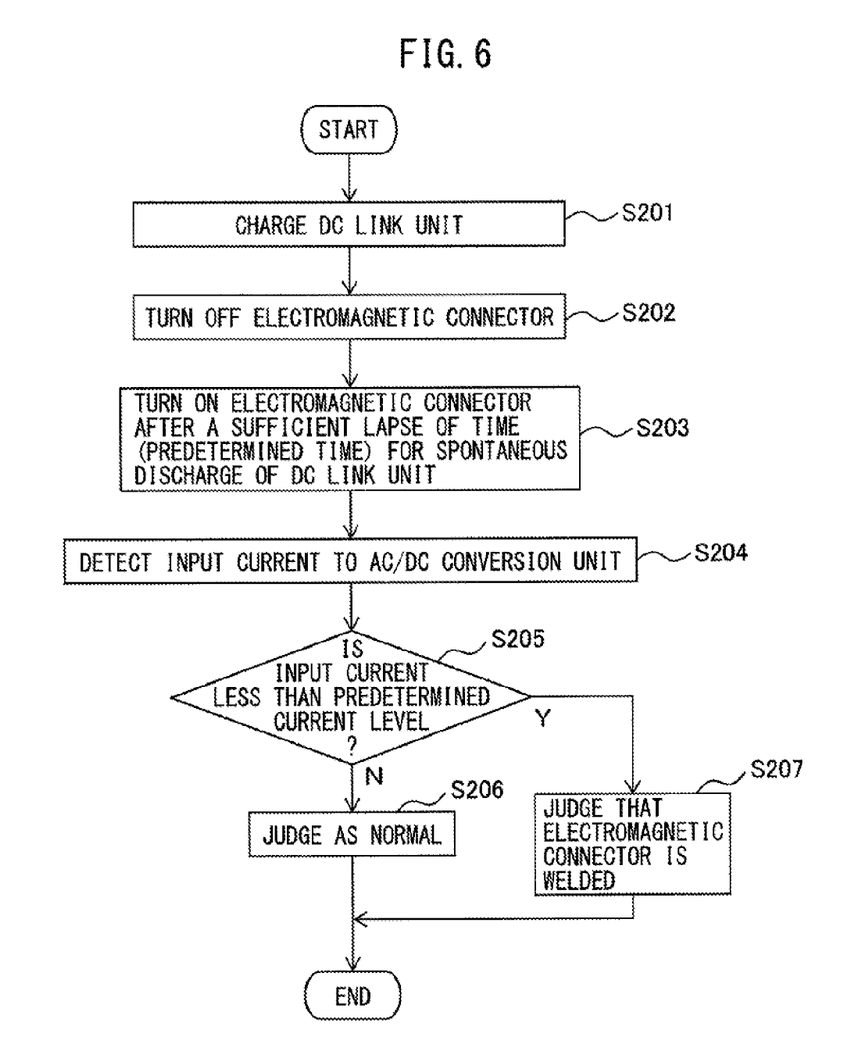
FIG. 6 is a flowchart that explains a procedure to detect the presence or absence of welding of the electromagnetic connector by the motor drive according to the second embodiment of the present invention.

Next, an operation procedure of the motor drive 102 according to the second embodiment of the present invention will be described with the use of the flowchart of FIG. 6. First, at step S201, the switch of the electromagnetic connector 2 is turned on to charge the DC link unit 3.

Then, at step S202, the command to turn off the switch of the electromagnetic connector 2 is outputted to disconnect the AC power source 11 from the AC/DC conversion unit 1. Then, at step S203, after the sufficient lapse of time (the predetermined time) for spontaneously discharging the DC link unit 3, the command to turn on the switch of the electromagnetic connector 2 is outputted to connect the AC power source 11 to the AC/DC conversion unit 1.

Then, at step S204, the current detection unit 7 detects input current from the AC power source 11 to the AC/DC conversion unit 1. A measurement result is sent to the welding judgment unit 62. The measurement result may be stored in the memory (not shown).

Then, at step S205, the welding judgment unit 62 judges whether or not the input current is less than the predetermined current level. Provided that the input current is the predetermined current level or more and the DC link unit 3 is judged to have been discharged, it is judged that the electromagnetic connector 2 has no welding, in other words, is in a normal state at step S206.

On the other hand, in a case where the input current is less than the predetermined current level and the DC link unit 3 is judged not to have been discharged, it is judged that welding occurs in the electromagnetic connector 2 at step S207.

A judgment result as to whether or not the electromagnetic connector 2 is welded, obtained as described above, is outputted from the welding judgment unit 62 to the outside.

As described above, according to the motor drive 102 of the second embodiment of the present invention, after the DC link unit 3 is charged by turning on the electromagnetic connector 2, the command to turn off the electromagnetic connector 2 is outputted. After the sufficient time for discharging the DC link unit 3 has elapsed, upon outputting the command to turn on the electromagnetic connector 2 again, whether or not the input current flows is checked. Thereby, it is possible to judge the presence or absence of welding of the electromagnetic connector 2.

In the motor drive 102 according to the second embodiment, as described above, the input current is detected after the lapse of the predetermined time since turning off the electromagnetic connector 2. Thus, it is conceivable that the presence or absence of welding of the electromagnetic connector 2 may be determined at the time of detecting the input current based on the DC link voltage by means of the first embodiment. Significance of the judgment as to the presence or absence of welding of the electromagnetic connector 2 by the motor drive 102 described in the second embodiment is to ensure the judgment even if the judgment as to the presence or absence of welding of the electromagnetic connector 2 is difficult to make by measuring the DC link voltage, as described in the first embodiment, and to further ensure the judgment as to the presence or absence of welding of the electromagnetic connector 2 based on the DC link voltage.

According to the motor drive 102 of the second embodiment, it is also possible to judge the presence or absence of welding of the electromagnetic connector 2 by measuring the input current by itself. In this case, the DC link voltage detection unit 5 can be omitted.

Third Embodiment

Figure 7:
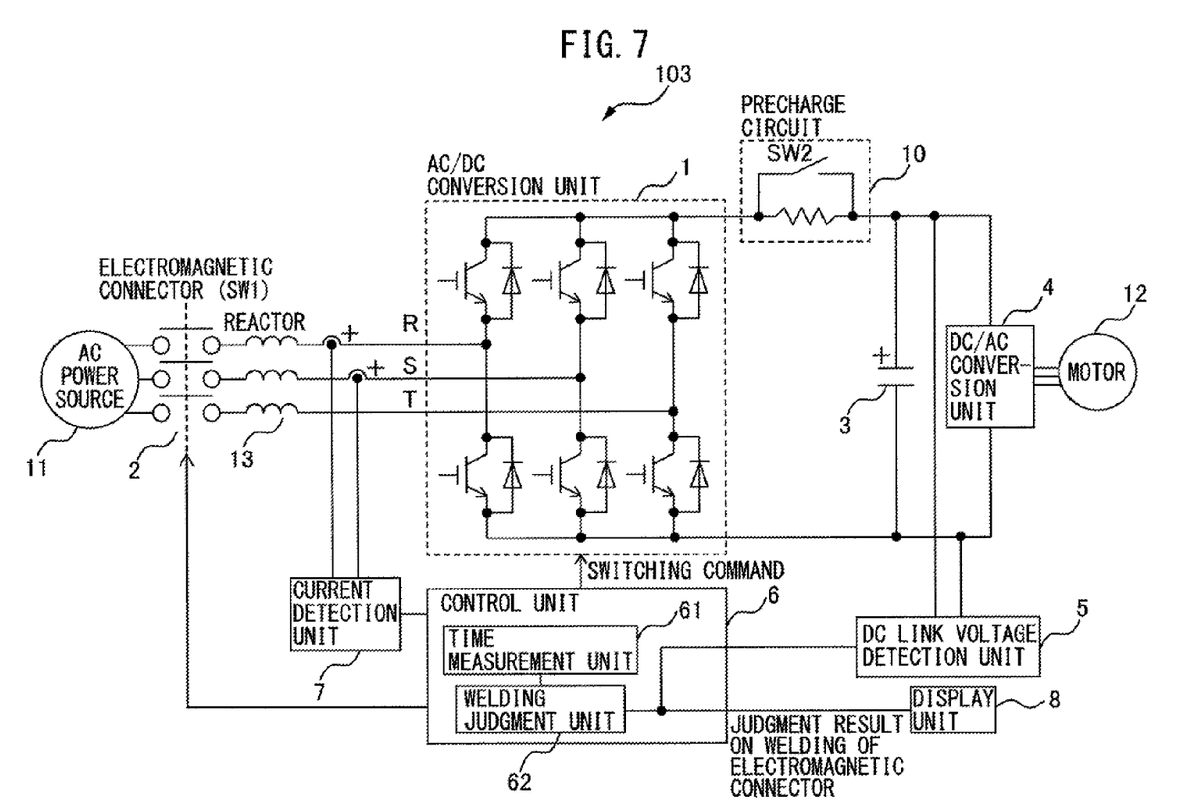
FIG. 7 is a block diagram of a motor drive according to a third embodiment of the present invention.

Next, a motor drive according to a third embodiment of the present invention will be described with the use of the drawing. FIG. 7 shows a block diagram of the motor drive according to the third embodiment of the present invention. A motor drive 103 according to the third embodiment of the present invention is characterized in further including a display unit 8 for displaying a judgment result of the welding judgment unit 62, in addition to the motor drive 102 according to the second embodiment. Since the other structures of the motor drive 103 of the third embodiment are the same as those of the motor drive 102 of the second embodiment, the detailed description thereof will be omitted.

Displaying the judgment result of the welding judgment unit 62, as to whether or not the electromagnetic connector 2 is welded, facilitates rapidly informing a user of the presence or absence of welding of the electromagnetic connector 2. As the display unit 8, a liquid crystal display, an organic EL display or the like is usable, and not limited to these, a display using another display method is also usable.

Fourth Embodiment

Figure 8:
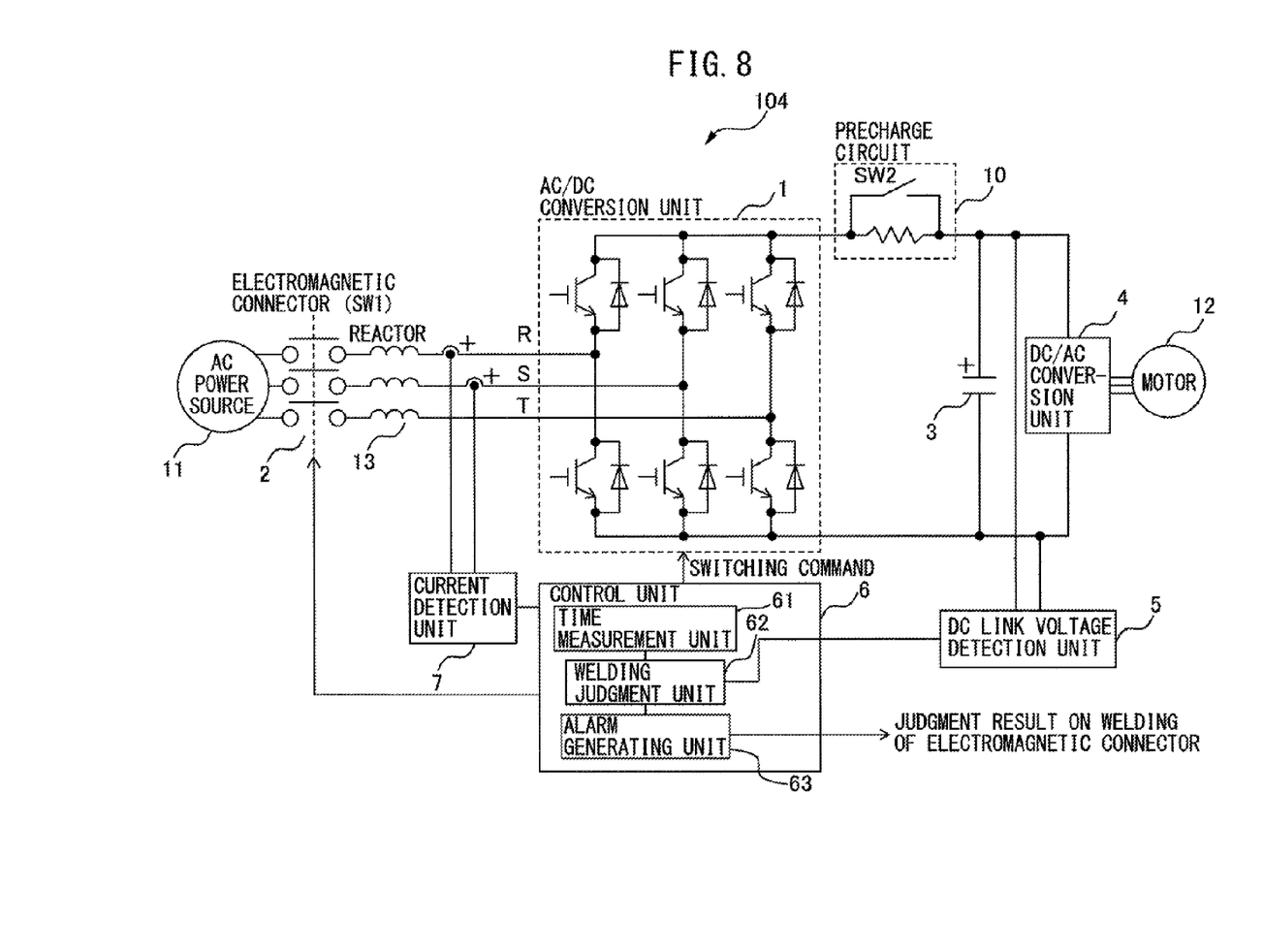
FIG. 8 is a block diagram of a motor drive according to a fourth embodiment of the present invention.

Next, a motor drive according to a fourth embodiment of the present invention will be described with the use of the drawings. FIG. 8 shows a block diagram of the motor drive according to the fourth embodiment of the present invention. A motor drive 104 according to the fourth embodiment of the invention is characterized in further including an alarm generating unit 63 for outputting an alarm, provided that the welding judgment unit 62 judges that the electromagnetic connector 2 is welded, in addition to the motor drive 102 according to the second embodiment. Since the other structures of the motor drive 104 of the fourth embodiment are the same as those of the motor drive 102 of the second embodiment, the detailed description thereof will be omitted.

Since the alarm generating unit 63 raises an alarm in a case where the welding judgment unit 62 judges that the electromagnetic connector 2 is welded, it is possible to rapidly deal with the welding of the electromagnetic connector 2. As a means of generating an alarm, a sound or a light emission from a lamp is available, for example, and not limited to these, an alarm may be generated by another means.

As described above, the motor drive according to each of the embodiments of the present invention eliminates the need for providing an electromagnetic connector having an auxiliary contact and an additional detection circuit. Therefore, it is possible to detect the presence or absence of welding of the electromagnetic connector without an increase in costs.

What is claimed is:

1. A motor drive comprising:
an AC/DC conversion unit configured to convert alternating current (AC) voltage supplied from an AC power source to direct current (DC) voltage;
an electromagnetic connector configured to perform switching to connect or disconnect the AC power source to or from said AC/DC conversion unit;
a DC link unit configured to smooth the DC voltage outputted from said AC/DC conversion unit;
a DC/AC conversion unit configured to convert the DC voltage smoothed by said DC link unit to AC voltage for driving the motor;
a current detection unit configured for detecting current input from the AC power source to said AC/DC conversion unit, and
a control unit configured to output a command to connect or disconnect said electromagnetic connector and control said AC/DC conversion unit,
wherein said control unit includes:
a time measurement unit configured to measure elapsed time since said electromagnetic connector performs the switching; and
a welding judgment unit configured to judge that said electromagnetic connector is welded, in a case where the current measured by said current detection unit when said control unit outputs the command to connect the AC power source to said AC/DC conversion unit, after the predetermined time has elapsed since said control unit outputs the command to disconnect the AC power source from said AC/DC conversion unit, is less than a predetermined current level.

2. The motor drive according to claim 1, further comprising a display unit configured to display a judgment result of said welding judgment unit.

3. The motor drive according to claim 1, further comprising an alarm generating unit configured to output an alarm in a case where said welding judgment unit judges that said electromagnetic connector is welded.

* * * * *